(12) United States Patent
Ishizawa et al.

(10) Patent No.: US 6,328,864 B1
(45) Date of Patent: *Dec. 11, 2001

(54) VACUUM PROCESSING APPARATUS

(75) Inventors: Shigeru Ishizawa; Yoshiaki Sasaki, both of Yamanshi-ken; Keisuke Kondoh, Kofu; Tetsuo Yoshida, Nirasaki, all of (JP)

(73) Assignee: Tokyo Electron Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,904

(22) Filed: Apr. 7, 1998

(30) Foreign Application Priority Data

Apr. 30, 1997 (JP) .................................................... 9-126268

(51) Int. Cl.[7] .................................................... C23C 14/00
(52) U.S. Cl. ................................ 204/298.01; 204/298.25; 204/298.35
(58) Field of Search ............................ 118/715, 719; 204/298.07, 298.25, 298.35; 156/345; 417/205, 248, 306, 427, 441, 63

(56) References Cited

U.S. PATENT DOCUMENTS

| 5,388,944 | * | 2/1995 | Takanabe et al. | 414/217 |
| 5,480,488 | * | 1/1996 | Bittner et al. | 118/667 |
| 5,873,942 | * | 2/1999 | Park et al. | 118/719 |
| 5,913,978 | * | 6/1999 | Kato et al. | 118/719 |

FOREIGN PATENT DOCUMENTS

| 3-234345 | 10/1991 | (JP) . |
| 6-66686 | 3/1994 | (JP) . |

* cited by examiner

*Primary Examiner*—Curtis E. Sherrer
(74) *Attorney, Agent, or Firm*—Oblon, Spivak, McClelland, Maier & Neustadt, P.C.

(57) ABSTRACT

A vacuum processing apparatus includes a transfer chamber filled with a gas to have an upper limit of a target pressure range, a gas supply system connected to a gas supply source to supply the gas into the transfer chamber, a gas exhaust system for releasing the gas from within the transfer chamber, first and second vacuum chambers connected to the transfer chamber, first and second gate valves interposed between the transfer chamber and the vacuum chambers, which selectively permit the transfer chamber and the vacuum chambers to communicate with each other and a transfer mechanism for transferring a target object from the first vacuum chamber to the transfer chamber via the first gate valve and for transferring the target object from the transfer chamber to the second vacuum chamber via the second gate valve. An opening/closing valve is provided in the gas supply system for selectively supplying the gas from the gas supply source into the transfer chamber, a gas loading space being defined upstream of the opening/closing valve to permit the gas having a volume and pressure set in accordance with the upper limit of a target pressure range to be stored in the gas loading space when the opening/closing valve is closed.

6 Claims, 4 Drawing Sheets

VACUUM PROCESSING APPARATUS

BACKGROUND OF THE INVENTION

The present invention relates to a vacuum processing apparatus comprising a single or a plurality of vacuum chambers, e.g., a vacuum processing chamber and/or a cassette chamber, and at least one common transfer chamber.

In the manufacturing process of a semiconductor device, it was customary to use a so-called "clustering system" of a multi-chamber type processing apparatus comprising a common transfer chamber arranged in the center, and various vacuum processing chambers and at least one cassette chamber arranged around the common transfer chamber. In the apparatus of this type, a target object to be processed, i.e., a semiconductor wafer, housed in a cassette arranged in the cassette chamber is transferred by, for example, a transfer arm arranged in the common transfer chamber into the common transfer chamber. Then, the wafer is transferred by the transfer arm into a predetermined vacuum processing chamber. Further, the wafer is transferred successively by the transfer arm into various vacuum processing chambers for application of, for example, an etching treatment, a sputtering treatment and a CVD treatment to the wafer. Finally, the wafer after these treatments is transferred again by the transfer arm back into the cassette through the common transfer chamber. It should also be noted that a gas supply system and an exhaust system are connected to each of these common transfer chamber, various vacuum processing chambers and cassette chamber included in the particular processing apparatus, making it possible to control appropriately the inner pressure of each of these chambers.

Let us describe the boosting mechanism of the inner pressure of the common transfer chamber, covering the case where, for example, the gas within the common transfer chamber is replaced in transferring a wafer from a first vacuum processing chamber (first process chamber) to a second vacuum processing chamber (second process chamber) via the common transfer chamber. In the first step, a first. gate valve interposed between the first vacuum processing chamber and the common transfer chamber is opened, and the wafer is transferred from the first vacuum processing chamber into the common transfer chamber by the transfer arm arranged within the common transfer chamber. Then, the first gate valve is closed, and the wafer is transferred by the transfer arm toward a second gate valve which is closed and interposed between the second vacuum chamber and the common transfer chamber. At the same time, an opening/closing valve and a flow rate control valve, which are connected to a gas supply system, are closed while operating a gas exhaust mechanism connected to a gas exhaust system of the common transfer chamber. As a result, the common transfer chamber is evacuated to a predetermined inner pressure level, e.g., to a pressure at which various gases present inside the common transfer chamber and adversely affecting the wafer can be discharged to the outside.

Further, the opening/closing valve connected to the common transfer chamber is opened to supply a predetermined gas, e.g., a purging gas, into the common transfer chamber until the second gate valve is opened. Also, the degree of opening of the flow rate control valve is controlled to increase the inner pressure of the common transfer chamber to a level substantially equal to or higher than the inner pressure of the second vacuum processing chamber, followed by maintaining the inner pressure of the common transfer chamber at the level noted above. Then, the second gate valve is opened, and the wafer is transferred by the transfer arm into the second vacuum processing chamber. It follows that the common transfer chamber is kept at a desired condition that a reactive gas, particles, etc. are substantially prevented from being present inside the common transfer chamber.

In order to increase the through-put, it is necessary to shorten the wafer transfer cycle by increasing the pressure boosting rate within the common transfer chamber. In the conventional system of the construction described above, however, the rate of the gas supply into the common transfer chamber, which is performed simultaneously with opening of the opening/closing valve, is naturally limited, with the result that it is difficult to increase efficiently the boosting rate of the inner pressure of the common transfer chamber. It follows that it is important to improve the gas supply system into the common transfer chamber in order to shorten the time required for boosting the inner pressure of the common transfer chamber and, thus, to improve the through-put.

BRIEF SUMMARY OF THE INVENTION

An object of the present invention is to provide a vacuum processing apparatus which permits instantly boosting the inner pressure of a transfer chamber included in the vacuum processing chamber to a predetermined target pressure in a predetermined target time without bringing about problems, e.g., without causing particles to fly up.

According to a first aspect of the present invention, there is provided a vacuum processing apparatus, comprising:

at least one transfer chamber filled with a gas to have an upper limit of a target pressure range;

a gas supply system connected to a gas supply source to supply the gas into the transfer chamber;

a gas exhaust system for releasing the gas from within the transfer chamber;

at least two vacuum chambers including a first vacuum chamber and a second vacuum chamber and connected to the transfer chamber;

at least two gate valves interposed between the transfer chamber and the vacuum chambers and including a first gate valve which selectively permits the transfer chamber and the first vacuum chamber to communicate with each other and a second gate valve which selectively permits the transfer chamber and the second vacuum chamber to communicate with each other;

a transfer mechanism for transferring a target object, which is to be processed, from the first vacuum chamber to the transfer chamber via the first gate valve and for transferring the target object from the transfer chamber to the second vacuum chamber via the second gate valve;

an opening/closing valve included in the gas supply system for selectively supplying the gas from the gas supply source into the transfer chamber, a gas loading space being defined upstream of the opening/closing valve to permit the gas having a volume and pressure set in accordance with the upper limit of a target pressure range to be stored in the gas loading space when the opening/closing valve is closed; and control means for opening the opening/closing valve to supply the gas stored in the gas loading space into the transfer chamber so as to increase the inner pressure of the transfer chamber up to the upper limit of the target pressure.

In the vacuum processing apparatus of the construction described above, the opening/closing valve is opened by the control means so as to permit the predetermined gas stored in the gas loading space to be supplied into the transfer chamber in a short time, making it possible to boost the inner pressure of the transfer chamber to a predetermined target pressure in a short time. What should be noted is that the inner pressure of the transfer chamber can be boosted promptly even in the case of, for example, replacing the gas within the transfer chamber during transfer of the target object within the transfer chamber. It follows that the transfer of the target object is not adversely affected, leading to an improved through-put. It should also be noted that, even where the target object is transferred from, for example, the first vacuum chamber having a relatively low inner pressure to the second vacuum chamber having a relatively high inner pressure through, for example, the transfer chamber, the inner pressure of the transfer chamber can be instantly boosted to a level substantially equal to or higher than the inner pressure of the second process chamber during transfer of the target object.

In the vacuum processing apparatus of the present invention, it is desirable to mount a flow rate control valve between the gas supply source and the opening/closing valve for controlling the flow rate of the gas supplied from the gas supply source into the transfer chamber. In this case, the gas loading space is defined between the flow rate control valve and the opening/closing valve. The particular construction makes it possible to prevent the inner pressure of the transfer chamber boosted to the upper limit of the target pressure range from being changed until the second gate valve is opened.

It is also desirable for the gas supply system to be arranged between the gas supply source and the opening/closing valve and to have a gas loading chamber defining a part of the gas loading space. The particular gas loading chamber is variable in volume or interchangeable with another gas loading chamber having a different volume, with the result that the volume of the gas loading space can be controlled without difficulty to conform with the upper limit of the target pressure range having a different value.

Further, it is desirable in the vacuum processing chamber of the present invention to include a heater or a warmth-keeping means such as an electric heater, which is mounted in the gas supply system for maintaining constant the temperature of the gas stored in the gas loading space. Since the temperature of the gas stored in the gas loading space is maintained constant, the gas stored in the gas loading space can be prevented from being changed in its flow rate and from being liquefied. It follows that the inner pressure of the transfer chamber can be boosted to the upper limit of the target pressure range at a high accuracy.

According to a second aspect of the present invention, there is provided a vacuum processing apparatus, comprising:
  at least one transfer chamber filled with a gas to have an upper limit of a first target pressure range or to have an upper limit of a second target pressure range;
  a gas supply system connected to a gas supply source to supply the gas into the transfer chamber;
  a gas exhaust system for releasing the gas from within the transfer chamber;
  at least three vacuum chambers including a first vacuum chamber, a second vacuum chamber, and a third vacuum chamber, all connected to the transfer chamber;
  at least three gate valves interposed between the transfer chamber and the vacuum chambers and including a first gate valve which selectively permits the transfer chamber and the first vacuum chamber to communicate with each other, a second gate valve which selectively permits the transfer chamber and the second vacuum chamber to communicate with each other, and a third gate valve which selectively permits the transfer chamber and the third vacuum chamber to communicate with each other;
  a transfer mechanism for transferring a target object, which is to be processed, from the first vacuum chamber to the transfer chamber via the first gate valve, for transferring the target object from the transfer chamber to the second vacuum chamber via the second gate valve, and for transferring the target object from the second vacuum chamber to the third vacuum chamber via the transfer chamber;
  a plurality of branched supply systems included in the gas supply system and including first and second branched supply systems, each of the branched supply systems including an opening/closing valve for selectively supplying the gas from the gas supply source into the transfer chamber, a gas loading space being defined upstream of the opening/closing valve to permit the gas having a volume and pressure set in accordance with the upper limit of a target pressure range to be stored in the gas loading space when the opening/closing valve is closed; and
  control means for opening the opening/closing valve included in the first branched system to supply the gas stored in the gas loading space defined upstream of the first branched system into the transfer chamber so as to increase the inner pressure of the transfer chamber up to the upper limit of the first target pressure when the target object is transferred from the first vacuum chamber into the transfer chamber, and for opening the opening/closing valve included in the second branched system to supply the gas stored in the gas loading space defined upstream of the second branched system into the transfer chamber so as to increase the inner pressure of the transfer chamber up to the upper limit of the second target pressure when the target object is transferred from the second vacuum chamber into the transfer chamber.

In the vacuum processing apparatus of the second embodiment, the inner pressure of the transfer chamber can be increased to an upper limit of a target pressure range without difficulty to conform with the inner pressure of a desired vacuum chamber even in the case where the vacuum processing apparatus includes many vacuum chambers differing from each other in the inner pressure.

Further, according to a third aspect of the present invention, there is provided a vacuum processing apparatus, comprising:
  a transfer chamber filled with a gas to have an upper limit of a target pressure range;
  gas supply means including a gas loading space for storing a gas in a volume and pressure set in accordance with the upper limit of the target pressure range and serving to instantly supply the gas stored in the gas loading space into the transfer chamber;
  a gas exhaust system for releasing the gas from within the transfer chamber to lower the inner pressure of the transfer chamber to a level equal to the lower limit of the target pressure range; and
  a vacuum chamber capable of selectively communicating with the transfer chamber and having an inner pressure conforming with the upper limit of the target pressure range, wherein pressure $P_2$ within the gas loading space is represented by the formula:

$$P_2=\{(V_1(P-P_1)\}/V_2$$

where $V_1$ is the volume of the transfer chamber, P is the upper limit of the target pressure range within the transfer chamber, $P_1$ is the lower limit of the target pressure range within the transfer chamber, $V_2$ is the volume of the gas loading space.

The vacuum processing apparatus of the third embodiment makes it possible to set the pressure within the gas loading space so as to permit boosting the inner pressure of the transfer chamber to the upper limit of the target pressure range in a short time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe a clustered multi-chamber type vacuum processing apparatus according to some embodiments of the present invention with reference to the accompanying drawings. In the following description, the constituents of the apparatus having substantially the same function and construction are denoted by the same reference numerals so as to avoid overlapping descriptions.

Figure 1:
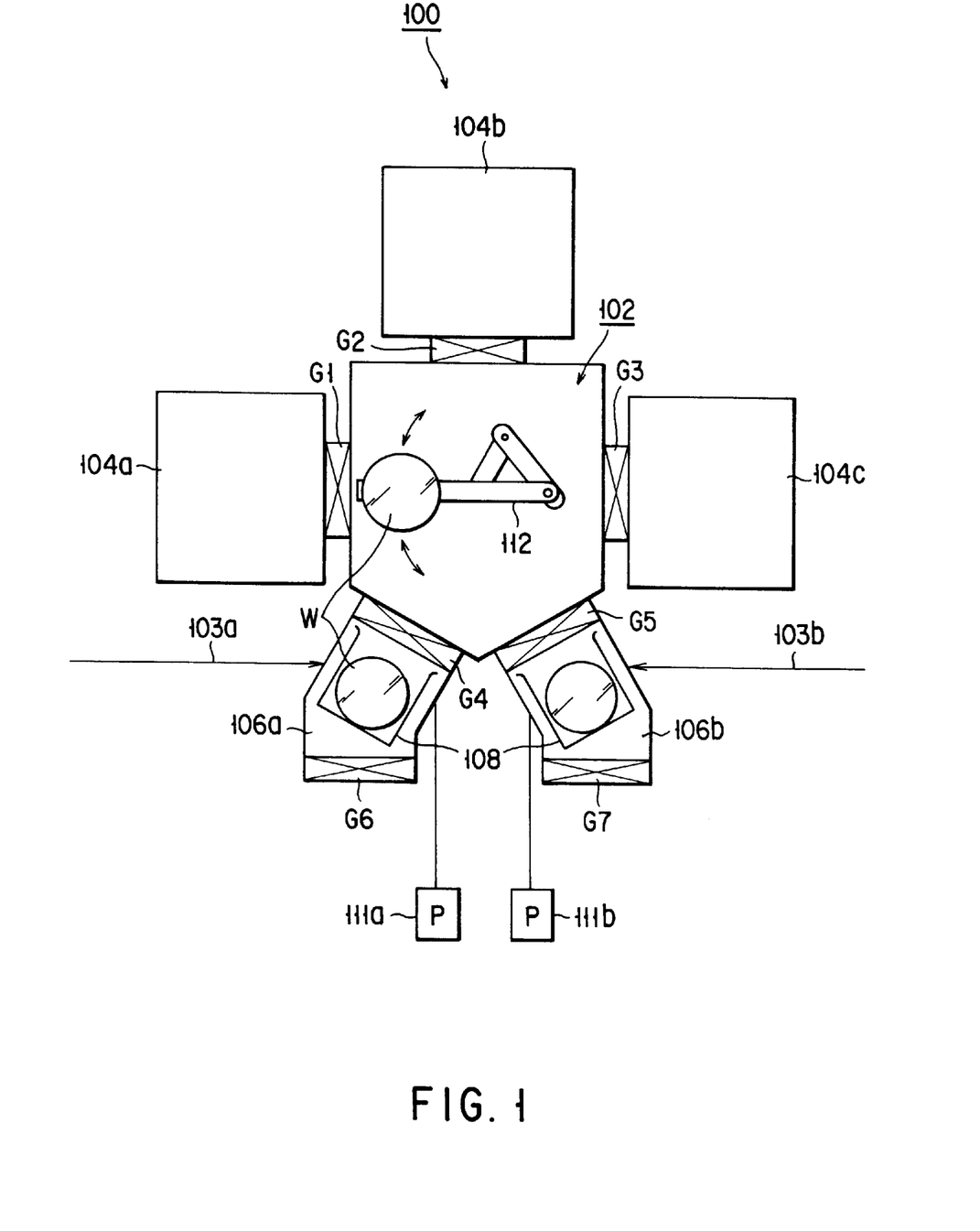
FIG. 1 is a view schematically showing a vacuum processing apparatus according to a first embodiment of the present invention.
Figure 2:
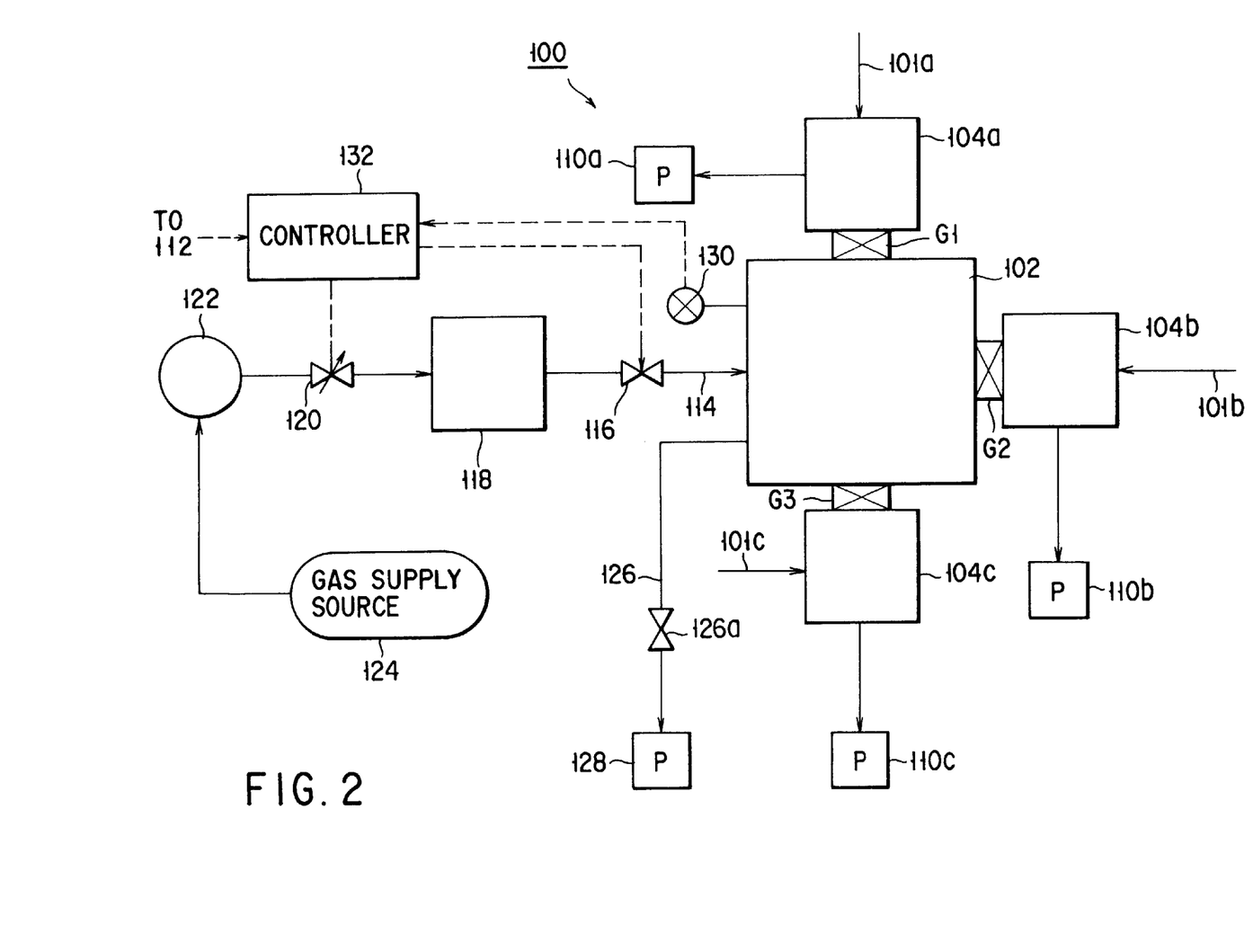
FIG. 2 is a view schematically showing a gas supply system and a gas exhaust system included in the vacuum processing apparatus shown in FIG. 1.
Figure 3:
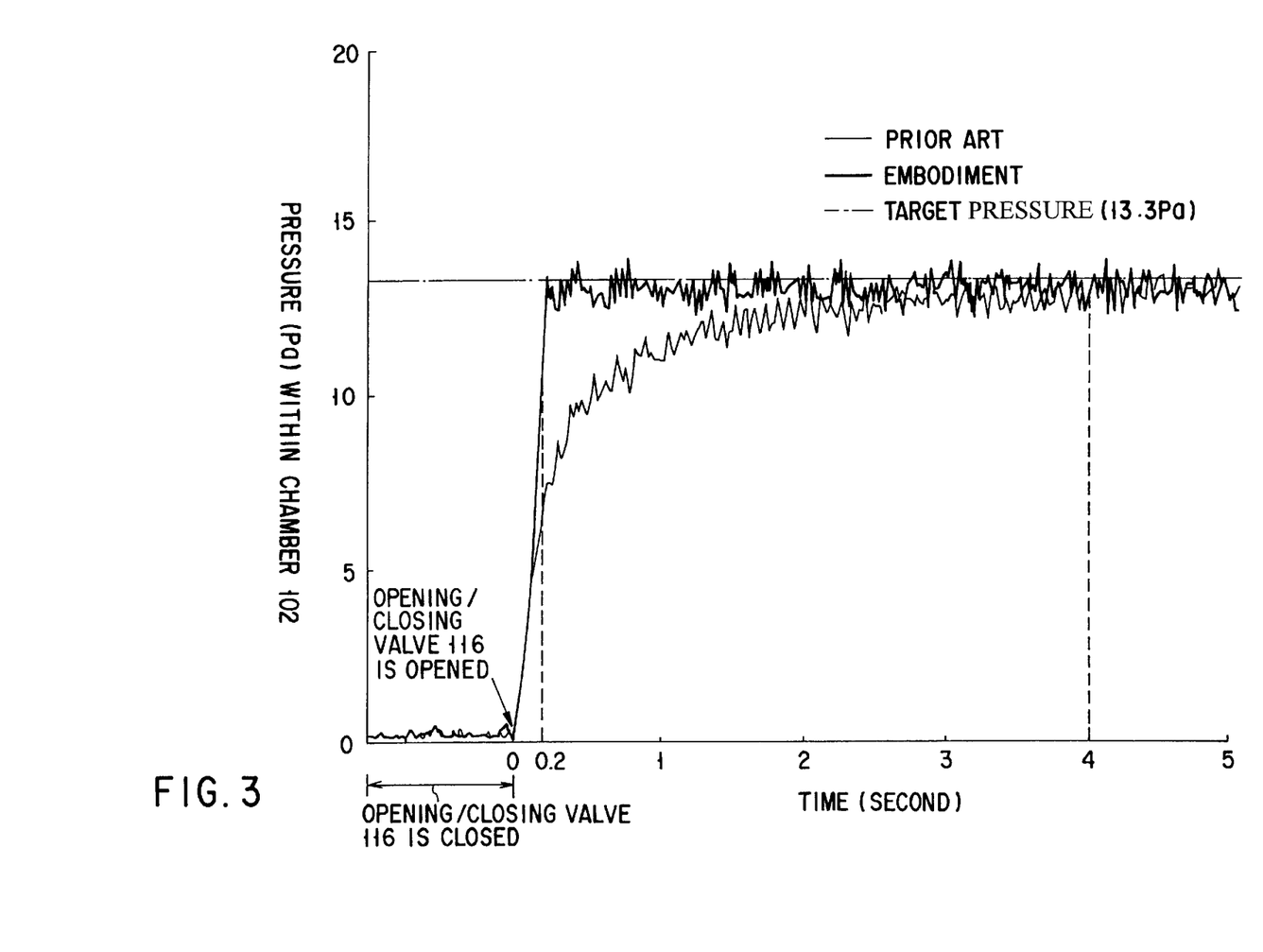
FIG. 3 is a graph used for describing the vacuum processing apparatus according to the first embodiment of the present invention.

First of all, FIGS. 1 to 3 collectively show the apparatus according to the first embodiment of the present invention. Specifically, FIG. 1 shows a vacuum processing apparatus 100 of this embodiment. As shown in the drawing, a plurality of vacuum chambers, i.e., five vacuum chambers in this embodiment consisting of three vacuum process chambers 104a, 104b, 104c and two vacuum cassette chambers 106a, 106b, are arranged to surround a common transfer chamber 102. Gate valves G1, G2, G3, G4, G5, which can be controlled to be opened or closed independently of each other, are arranged between the common transfer chamber 102 and the vacuum process chambers 104a to 104c and between the common transfer chamber 102 and the vacuum cassette chambers 106a, 106b. These vacuum chambers are capable of selectively communicating with the common transfer chamber 102.

Predetermined treatments are applied successively to the target object, e.g., a semiconductor wafer W, in the vacuum process chambers 104a to 104c. In other words, these vacuum process chambers consist of, for example, an etching apparatus, a sputtering apparatus, and a CVD apparatus. These vacuum process chambers 104a to 104c are hermetically constructed. Gas supply systems 101a, 101b, 101c shown in FIG. 2, which are connected at first end portions to the corresponding gas supply sources, are connected at second end portions to the vacuum process chambers 104a to 104c. Also, evacuating mechanisms including, for example, turbo molecular pumps, or vacuum pumps 110a, 110b, 110c are respectively connected to the vacuum process chambers 104a to 104c, as shown in FIG. 2. It follows that each of these vacuum process chambers 104a to 104c can be independently controlled appropriately to have a desired inner pressure.

Each of the vacuum cassette chambers 106a, 106b is also made hermetic and constructed to be capable of housing a cassette 108 simultaneously holding, for example, 25 wafers. Gate valves G6 and G7 are mounted on the sides of the cassette transfer ports of the vacuum cassette chambers 106a and 106b, respectively. Gas supply systems 103a, 103b are connected to the cassette chambers 106a, 106b, respectively. Also, evacuating mechanisms 111a, 111b are connected to these cassette chambers 106a, 106b, respectively. It follows that the inner pressures of the cassette chambers 106a, 106b can be controlled appropriately at desired levels by closing the gate valves G4, G6 or G5, G7.

A wafer transfer mechanism, e.g., a transfer arm 112 including a multi-joint arm, is housed in the common transfer chamber 102 which is constructed hermetically. The transfer arm 112 permits transferring the wafer W from any of the five vacuum chambers 104a to 104c, 106a, 106b into the common transfer chamber 102, and from the common transfer chamber 102 into any desired vacuum chamber. The driving mechanism and the control mechanism of the transfer mechanism are known well in this technical field and, thus, description thereof is omitted herein.

The constructions of the gas supply system and the exhaust system in the common transfer chamber 102 are shown in detail in FIG. 2. Specifically, a gas supply pipe 114 is connected to the common transfer chamber 102. As shown in the drawing, an opening/closing valve 116, a gas loading chamber or gas charge chamber 118 specified in the present invention, a flow rate control valve 120, and a regulator 122 are mounted in this order to the gas supply pipe 114. The gas supply pipe 114 is formed of a pipe having a diameter of, for example, ¼ inch, and connects the gas loading chamber 118 to a gas supply source 124 capable of supplying an inert gas such as an Ar gas at a pressure of 1.5 kg/cm² to the gas supply pipe 114, via the members noted above. The gas loading chamber 118 consists of a hermetic chamber having a cross sectional area markedly larger than that of the pipe 114 and hermetically communicates with the pipe 114. Preferably, the gas loading chamber is detachably mounted to the pipe 114 and is interchangeable with another gas loading chamber having an optional inner volume. Alternatively, it is also possible to mount, for example, a partition wall within the gas loading chamber such that the partition wall is movable within the gas loading chamber so as to set optionally the effective inner volume of the gas loading chamber. A gas exhaust pipe 126, which is connected to an evacuating mechanism 128 consisting of, for example, a turbo molecular pump, is also connected to the common transfer chamber 102.

A pressure sensor 130 capable of continuously measuring the inner pressure of the common transfer chamber 102 is connected to the common transfer chamber 102. Further, a controller 132 is connected to each of the transfer arm 112, the opening/closing valve 116, the flow rate control valve 120 and the pressure sensor 130. It follows that the opening/closing and the degree of opening of the opening/closing valve 116 and the flow rate control valve 120 are controlled by the controller 132 in accordance with the inner pressure of the common transfer chamber 102.

The inner pressure of the gas loading chamber 118, which is equal to the inner pressure of the gas supply passageway between the flow rate control valve 120 and the opening/closing valve 116, i.e., the inner pressure of pipe 114 and the gas loading chamber 118, is determined by the specification, construction, etc. of a regulator 122. It follows that, in the case of adjusting or changing the inner pressure of the gas loading chamber, the specification of the regulator 122 is changed or the regulator 122 is replaced. Incidentally, the cassette chambers 106a, 106b, etc. of the vacuum processing apparatus 100 are omitted in FIG. 2. Needless to say, however, the apparatus 100 shown in FIG. 2 is substantially equal in construction to the apparatus 100 shown in FIG. 1.

Suppose the wafer W is transferred from the first vacuum process chamber 104a to the second vacuum process chamber 104b through the common transfer chamber 102. In this case, the inner pressure of the transfer chamber 102 is controlled in replacing the gas within the transfer chamber 102, as follows. In the first step, the first gate valve G1 is opened for allowing the transfer arm 112 to transfer the wafer W having a predetermined treatment applied thereto in the first vacuum process chamber 104a into the common transfer chamber 102. In this step, a predetermined amount of an inert gas is supplied from the gas supply source 124 into the common transfer chamber 102. At the same time, the common transfer chamber 102 is evacuated by the evacuating mechanism 128 to a predetermined vacuum level. It follows that the inner pressure of the common transfer chamber 102 is maintained at, for example, 13.3 Pa, which is substantially equal to the inner pressure of the first vacuum process chamber 104a. Also, even where the vacuum process chamber 104a is evacuated by an evacuating mechanism 110a, the inner pressure of the common transfer chamber 102 is maintained constant at a desired level because the opening degree of the flow rate control valve 120 is kept controlled by the controller 132. The inner pressure of the common transfer chamber 102 can be maintained at a desired level even if the flow rate control valve is not connected to the controller 132. To be more specific, the inner pressure of the common transfer chamber 102 can also be maintained at a desired level based on a predetermined specification of the flow control valve. In this case, the opening degree of the flow rate control valve is experimentally controlled to permit the inner pressure of the common transfer chamber to be maintained at a desired level. Also, the opening degree of the flow rate control valve is fixed at a predetermined opening degree in the treating step.

In the next step, the first gate valve G1 is closed. At the same time, the transfer arm 112 is operated by a driving mechanism (not shown) to move horizontally the wafer W held by the transfer arm 112 to a region in the vicinity of the second gate valve G2. During the transfer of the wafer W within the common transfer chamber 102, during which all the gate valves G1 to G5 are closed, the gas within the common transfer chamber 102 is replaced. Specifically, a control signal is transmitted from the controller 132 to the opening/closing valve 116 in accordance with operation of the transfer arm 112. For example, a detector (not shown) detects passage of the arm 112 through a predetermined point and supplies a detection signal to the controller 132 to cause the controller 132 to transmit the control signal to the opening/closing valve 116 so as to close the valve 116. In this step, the evacuating mechanism 128 is set to evacuate the common transfer chamber 102 whether the opening/closing valve 116 and the flow rate control valve 120 may be opened or closed. It follows that the inner pressure of the common transfer chamber 102 is reduced to, for example, 0.5 Pa or less at which the gas within the common transfer chamber 102 can be sufficiently released to the outside. As a result, it is possible to remove from within the common transfer chamber 102 the substances adversely affecting the wafer W such as $H_2O$ and $H_2$, which are generated within the vacuum process chamber 104a during the treatment performed therein, and the particles generated during operation of the transfer arm 112. It should be noted that an inert gas is loaded in the gas loading space while the opening/closing valve 116 is kept closed.

Then, a signal denoting that the inner pressure of the common transfer chamber 102 has been lowered to 0.5 Pa as pointed out above is transmitted from the pressure sensor 130 to the controller 132. As a result, a predetermined trigger signal is transmitted from the controller 132 to the opening/closing valve 116 so as to open the valve 116. It follows that the predetermined inert gas loaded in the gas loading space including the gas loading chamber 118 and the parts of the pipe 114 between the valves 116 and 120 is instantly supplied into the common transfer chamber 102. Naturally, the inner pressure of the common transfer chamber 102 is boosted to a level substantially equal to or higher than the inner pressure of the second vacuum process chamber 104b. For example, the inner pressure of the common transfer chamber 102 is instantly boosted to 13.3 Pa.

The vacuum processing apparatus of this embodiment is constructed operable where the inner pressure of the common transfer chamber 102 after the pressure elevation is set at a low level, preferably at 66.7 Pa or less. Under such a low pressure, the particles, even if they remain within the common transfer chamber 102, are not caused to fly up against the gravitational force applied to these particles by the instant supply of the inert gas into the common transfer chamber 102 as noted above, with the result that the wafer is not adversely affected. Preferably, a diffusion member 300 shown in FIG. 5, which is formed of, for example, a mesh of aluminum, is mounted to cover the open end of the gas supply pipe 114 facing the common transfer chamber 102. In this case, the inert gas supplied through the gas supply pipe 114 is uniformly diffused by the diffusion member 300 so as to enter the common transfer chamber 102. It follows that the particles are prevented from flying up even in the vicinity of the open end of the gas supply pipe 114 facing the common transfer chamber 102.

In the vacuum processing apparatus of this embodiment, it is important to set appropriately the pressure of the inert gas loaded in the gas loading space. Specifically, the relationship between the pressure and the volume is given by formula (1):

$$P = (P_1 V_1 + P_2 V_2)/V \qquad (1)$$

where:
P denotes the pressure within the common transfer chamber 102 after the opening/closing valve 116 is opened, which is, for example, 13.3 Pa as described previously;
$P_1$ denotes the pressure within the common transfer chamber 102 after evacuation of the chamber 102, which is, for example, 0.5 Pa as described previously;
$V_1$ denotes the volume of the common transfer chamber 102, which is, for example, $7.0 \times 10^7$ mm$^3$;
$V_2$ denotes the volume of the gas loading space, which is, for example, $3.6 \times 10^3$ mm$^3$;
$P_2$ denotes the pressure within the gas loading space in the step of loading an inert gas; and $$V_1 + V_2 = V$$

From formula (1), the pressure $P_2$ within the gas loading space is:

$$P_2 = (PV - P_1 V_1)/V_2 \qquad (2)$$

The volume $V_2$ of the gas loading space, which is $3.6 \times 10^3$ mm$^3$ as given above, is markedly smaller than the volume $V_1$ of the common transfer chamber 102, which is $7.0 \times 10^7$ mm$^3$. In other words, $V_1 \gg V_2$, leading to formula (3) given below;

$$V = V_1 + V_2 \approx V_1 \qquad (3)$$

From formulas (2) and (3):

$$P_2 = \{V_1(P - P_1)\}/V_2 \qquad (4)$$

If the specific numerals given above are substituted in formula (4), the pressure $P_2$ within the gas loading space in the step of loading an inert gas is $2.48 \times 10^5$ Pa. In this embodiment, the pressure $P_2$ is set by the regulator 122. To be more specific, in changing the value of the pressure $P_2$, it is necessary to replace the regulator 122 with another regulator of different specification.

As described above, the inner pressure of the common transfer chamber 102 can be promptly boosted to 13.3 Pa in the vacuum processing apparatus of the construction described above by loading an inert gas in the gas loading space such that the pressure within the gas loading space becomes $2.48 \times 10^5$ Pa. It should be noted that, in setting the pressure of the inert gas loaded in the gas loading chamber 118 described above, no consideration is given to the gas release from within the common transfer chamber 102 to the outside when the inert gas is supplied from the gas loading chamber 118. This is because the effect given by the gas release noted above to the pressure within the common transfer chamber 102 is negligibly small. Also, no consideration is given to the supply of the inert gas from the gas supply source 124, which accompanies the opening of the flow rate control valve 120, when the opening/closing valve 116 is opened. This is also because the effect given to the inner pressure of the common transfer chamber 102 is negligibly small. Further, the specific values of the pressure and volume exemplified above are simply for the specific explanation of the formulas noted above and, thus, do not restrict at all the technical scope of this embodiment. Clearly, it may be of no difficulty to understand that the technical idea of this embodiment can be worked by constructing the vacuum processing apparatus to meet formula (1).

After the inner pressure of the common transfer chamber 102 has been promptly boosted to 13.3 Pa, the opening degree of the flow rate control valve 120 is adjusted on the basis of information supplied from the pressure sensor 130, while keeping the opening/closing valve 116 opened, so as to maintain the inner pressure of the common transfer chamber 102 at 13.3 Pa. Simultaneously with or slightly after the pressure elevation within the common transfer chamber to 13.3 Pa, the second gate valve G2 is opened, and the transfer arm 112 is operated to transfer the wafer W held by the transfer arm 112 into the second vacuum process chamber 104b. In this case, the inner pressure of the common transfer chamber 102 is maintained constant, e.g., kept at 13.3 Pa, by controlling the opening degree of the flow rate control valve 120, even if the second vacuum process chamber 104b is evacuated by the evacuating mechanism 110b. Then, the second gate valve G2 is closed so as to permit a predetermined treatment to be applied again to the wafer W within the second vacuum process chamber 104b.

The vacuum processing apparatus of this embodiment is constructed to carry out the gas replacement within the common transfer chamber 102 as described above in other steps of transferring the wafer W via the common transfer chamber 102 from the second vacuum process chamber 104b to the third vacuum process chamber 104c, from the third vacuum process chamber 104c to the cassette 108 within the cassette chamber 106a or 106b, and from the cassette 108 to the first vacuum process chamber 104a. It should be noted, however, that, where a substance adversely affecting the wafer W is scarcely generated in applying a predetermined treatment to the wafer W in, for example, the second vacuum process chamber, the gas within the common transfer chamber 102 need not be replaced.

FIG. 3 is a graph showing the change with time in the inner pressure of the common transfer chamber 102 included in the vacuum processing apparatus 100 shown in FIGS. 1 and 2. FIG. 3 covers a case where a gas loading space is defined in the gas supply pipe 114 as in the first embodiment of the present invention, and another case where such a gas loading space is not defined as in the conventional apparatus. In the graph of FIG. 3, the pressure (Pa) within the common transfer chamber 102 is plotted on the ordinate, with the time (second) being plotted in the abscissa.

In this experiment, the target pressure, to which the inner pressure of the common transfer chamber 102 was to be boosted, was set at 13.3 Pa. On the other hand, the pressure before the pressure boosting, i.e., the inner pressure of the common transfer chamber 102 before the opening/closing valve 116 was opened, was set at 0.5 Pa. The inner volume of the common transfer chamber 102 was set at $7.0 \times 10^7$ mm$^3$, and an Ar gas was supplied from the gas supply source 124 to the gas supply pipe 114 at a pressure of 1.5 kg/cm$^2$ (0.14 MPa). Further, where the gas loading chamber 118 was mounted to the gas supply pipe 114, the inner volume of the gas loading chamber 118 was set at $3.6 \times 10^3$ mm$^3$. It should be noted that used was a pipe having an inner diameter of ¼ inch as the gas supply pipe 114. Also, each of the distance between the gas loading chamber 118 and the flow rate control valve 120 and the distance between the gas loading chamber 118 and the opening/closing valve 116 was set at 20 cm. In the step of loading the Ar gas, the inner pressure of the gas loading space was set at $2.48 \times 10^5$ Pa. On the other hand, where the gas loading space was not defined in the gas supply pipe 114, the gas loading chamber 118 alone was removed to cause the opening/closing valve 116 to be connected directly to the flow rate control valve 120 via the gas supply pipe 114. Under the conditions described above, the inner pressure of the common transfer chamber 102 was continuously measured by the pressure sensor 130.

When the opening/closing valve 116 was closed, the inner pressure of the common transfer chamber 102 was maintained at about 0.5 Pa by means of evacuation performed by the evacuating means. Then, the opening/closing valve 116 was opened at time 0 second shown in FIG. 3 so as to supply an Ar gas into the common transfer chamber 102. After the inner pressure of the common transfer chamber 102 was boosted to the target pressure of about 13.3 Pa by the Ar gas supply, the inner pressure of the common transfer chamber 102 was maintained at about 13.3 Pa by controlling the opening degree of the flow rate control valve 120.

As seen from FIG. 3, the inner pressure of the common transfer chamber 102 was boosted to about 13.3 Pa in about 0.2 second after the opening/closing valve 116 was opened in the case where the gas loading chamber 118 was mounted to the gas supply pipe 114 as in the first embodiment of the present invention. On the other hand, where the gas loading chamber 118 was not mounted to the gas supply pipe 114, the inner pressure of the common transfer chamber 102 was slowly boosted to reach about 13.3 Pa in about 4.0 seconds.

As apparent from the experimental data given in FIG. 3, the apparatus 100 including the gas loading chamber 118 permits shortening the time, which is required for the inner pressure of the common transfer chamber 102 to reach the target pressure, to about 1/20 of the time required in the conventional apparatus. As a result, where the gas inside the common transfer chamber 102 is replaced during transfer of the wafer W within the common transfer chamber 102 as described previously in conjunction with the first embodiment, the time required for the gas replacement is markedly shortened. In other words, the time during which the wafer must be retained in the common transfer chamber 102 is markedly shortened, leading to a marked improvement in the through-put.

Let us describe a second embodiment of the present invention with reference to FIGS. 1 and 2. Suppose the wafer W is transferred from the second vacuum process chamber 104b to the third vacuum process chamber 104c. Where the inner pressure of the third vacuum process chamber 104c is higher than that of the second vacuum process chamber 104b, the vacuum processing apparatus of the present invention can be constructed to permit the inner pressure of the common transfer chamber 102 to be boosted to the target pressure as follows. Specifically, after completion of the treatment within the second vacuum process chamber 104b, the gate valve G2 shown in FIGS. 1 and 2 is opened, and the transfer arm 112 shown in FIG. 1 is operated to transfer the wafer W from within the second vacuum process chamber 104b into the common transfer chamber 102. In this step, the opening/closing valve 116 and the valve 126a mounted to the exhaust pipe 126, which are shown in FIG. 2, are kept closed. Also, the inner pressure of the common transfer chamber 102 is set substantially equal to that of the second vacuum process chamber 104b.

In the next step, the second gate valve G2 is closed, and the transfer arm 112 is operated to transfer the wafer W toward the third gate valve G3. At the same time, a trigger signal is transmitted from the controller 132 to the opening/closing valve 116 in accordance with operation of the transfer arm 112 so as to open the opening/closing valve 116. The vacuum processing apparatus is constructed to permit the inner pressure of the common transfer chamber 102 to be instantly made substantially equal to that of the third vacuum process chamber 104c in accordance with opening of the opening/closing valve 116. Also, the inner pressure of the common transfer chamber 102 can be maintained substantially constant by operating the evacuating mechanism 128 and by controlling the opening degree of the flow rate control valve 120 upon receipt of an electric signal supplied from the controller 132.

Then, the third gate valve G3 is opened, and the transfer arm 112 is operated to transfer the wafer W into the third vacuum process chamber 104c. In this step, the opening degree of the flow rate control valve 120 is controlled by the controller 132 and, thus, the inner pressure of the common transfer chamber 102 is maintained constant at a desired level, even where, for example, the valve 126a mounted to the exhaust pipe 126 is opened and the common transfer chamber 102 is evacuated. Similarly, the inner pressure of the common transfer chamber 102 is maintained constant at a desired level even where the third vacuum process chamber 104c is evacuated by the evacuating mechanism 110c. After transfer of the wafer W into the third vacuum process chamber 104c, the third gate valve G3 is closed, and a predetermined treatment is applied to the wafer W within the third vacuum process chamber 104c. Incidentally, the apparatus of the second embodiment is equal in construction to the vacuum processing apparatus 100 according to the first embodiment of the present invention.

Figure 4:
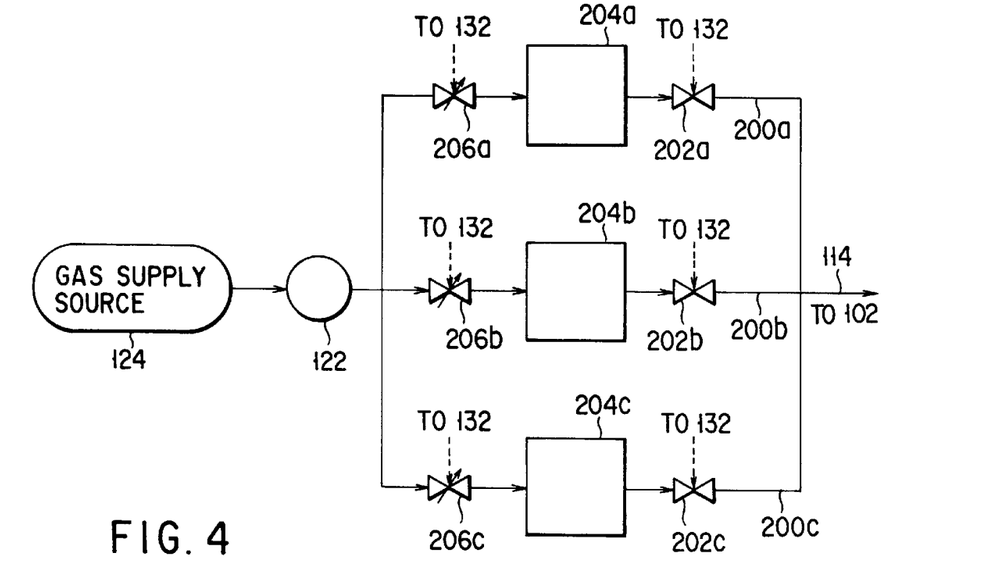
FIG. 4 is a view schematically showing a gas supply system included in a vacuum processing apparatus according to a second embodiment of the present invention.

Let us describe a third embodiment of the present invention with reference to FIG. 4. The apparatus of the third embodiment is featured in the gas supply system. As shown in the drawing, that portion of the gas supply pipe 114 which is interposed between the common transfer chamber 102 and the regulator 122 is branched into three passageways 200a, 200b and 200c. Opening/closing valves 202a, 202b, 202c, gas loading chambers 204a, 204b, 204c, and flow rate control valves 206a, 206b, 206c are mounted to these branched passageways 200a, 200b, 200c, respectively. As apparent from the drawing, these opening/closing valves are mounted on the side of the common transfer chamber 102. On the other hand, the flow rate control valves are mounted on the side of the regulator 122. Naturally, the gas loading chambers are interposed between these opening closing valves and these flow rate control valves.

Each of these opening/closing valves 202a to 202c and flow rate control valves 206a to 206c is connected independently to the controller 132 such that the opening/closing or the opening degree of these valves is independently controlled by the controller 132. It should be noted that the gas supply passageways 200a to 200c excluding the gas loading chambers 204a to 204c are substantially equal to each other in construction. Likewise, the opening/closing valves 202a to 202c are substantially equal to each other in construction. Further, the flow rate control valves 206a to 206c are also substantially equal to each other in construction. Incidentally, it is also possible to construct the flow rate control valves 206a to 206c such that the flow rate control capability of the second valve 206b is slightly bigger than that of the first valve 206a, and that the flow rate control capability of the third valve 206c is slightly bigger than that of the second valve 206b. As described above, that portion of the gas supply pipe 114 which is interposed between the common transfer chamber 102 and the regulator 122 is divided into three branched passageways 200a to 200c in the third embodiment. In the other respects, the vacuum processing apparatus of the third embodiment is equal in construction to the vacuum processing apparatus 100 described previously in conjunction with the first and second embodiments and shown in FIGS. 1 and 2.

The inner pressure of the common transfer chamber 102 can also be easily boosted to the target pressure in the apparatus of the third embodiment. Particularly, the apparatus of the third embodiment is constructed to produce a prominent effect in the case where, for example, the vacuum process chambers 104a to 104c and the cassette chambers 106a and 106b differ from each other in the inner pressure. Specifically, the gas within the common transfer chamber 102 can be replaced in a substantially shorter time even in the case where, for example, the gas replacement is carried out during transfer of the wafer W within the common transfer chamber 102 under the condition that, for example, the inner pressure is set gradually higher in the first vacuum process chamber 104a, the second vacuum process chamber 104b, the third vacuum process chamber 104c, and the cassette chamber 106a or 106b, in the order mentioned.

Suppose the gas loading chambers 204a, 204b, 204c are constructed to permit the boosted inner pressure of the common transfer chamber 102 to be equal to the inner pressure of the vacuum process chambers 104b, 104c or the cassette chamber 106a or 106b. In order to boost the inner pressure of the common transfer chamber 102 in this case during transfer of the wafer W from the first vacuum process chamber 104a into the second vacuum process chamber 104b, the first opening/closing valve 202a alone is opened upon receipt of a trigger. signal supplied from the controller 132 so as to permit the inert gas loaded in the gas loading chamber 204a to be instantly supplied into the common transfer chamber 102. In this step, the opening degree of the first flow rate control valve 206a is controlled by the controller 132 so as to maintain constant at a desired level the inner pressure of the common transfer chamber 102.

Similarly, the second opening/closing valve 202b alone is opened by the controller 132 when the wafer W is transferred from the second vacuum process chamber 104b into the third vacuum process chamber 104c. Further, when the wafer W is transferred from the third vacuum process chamber 104c into the cassette chamber 106a or 106b, the third opening/closing valve 202c alone is opened. It follows that, even where all or some of the vacuum chambers, into which the wafer W is to be transferred, differ from each other in the inner pressure, the inner pressure of the common transfer chamber 102 can be boosted in a substantially shorter time to a desired level adapted for the vacuum chamber into which the wafer W is to be transferred in the case of replacing the gas within the common transfer chamber 102 every time the wafer W is transferred.

Changes in the temperature of the inert gas which is temporarily stored in the gas loading space is not referred to in any of the embodiments described above. This is simply because the vacuum processing apparatus of this kind is used in general under room temperature and, thus, the temperature requirement is neglected in the description given above. In order to prevent the accuracy of the gas flow rate from being lowered or to prevent the gas from being condensed so as to be liquefied by the change in temperature, it is desirable to control the gas temperature within the gas supply system, as exemplified in FIG. 5.

Figure 5:
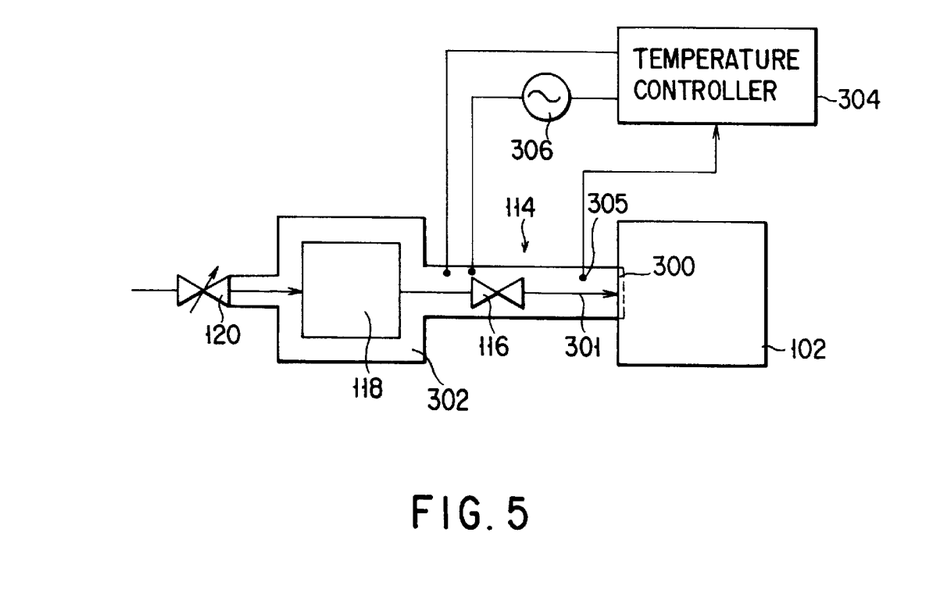
FIG. 5 is a view schematically showing more in detail the gas supply system used in the present invention.

As shown in the drawing, a pipe 301 having an inner diameter of ¼ inch constitutes the gas supply pipe 114. A mesh-like diffusion member 300 is mounted to one end of the pipe 301 which faces the common transfer chamber 102. The other end of the pipe 301 is connected to the gas supply source. It should be noted that the outer circumferential surface of that region of the pipe 301 which is interposed between the common transfer chamber 102 and the flow rate control valve 120 and the outer circumferential surface of the gas loading chamber 118 are covered substantially completely with an electric heater 302. It is possible for the heater 302 to be of the type that the entire region constitutes the heating region or of the type that some region constitutes the heating source with the other region being formed of a heat conductive material. A temperature sensor 305 serving to detect the temperature and supplying an electric signal denoting the detected temperature to a temperature controller 304 is mounted to the heater 302. Further, a power source 306 is connected to the electric heater 302. The operation of the power source 306 is controlled by the temperature sensor 304.

In the gas supply pipe 114 of the construction described above, the gas within the gas loading space defined by a part of the pipe 301 and the gas loading chamber 118 is heated by the heater 302 so as to permit the gas temperature to be maintained constant. As a result, the accuracy of the gas flow rate is effectively prevented from being lowered. Also, the gas is effectively prevented from being liquefied.

The present invention is not limited to the preferred embodiments described above with reference to the accompanying drawings. It is of no difficulty for those skilled in the art to arrive at various modifications within the technical scope of the present invention as claimed in the claims. Needless to say, these modifications should be interpreted to belong to the technical scope of the present invention.

For example, in the first to third embodiments described above, a trigger signal is transmitted from the controller to the opening/closing valve in accordance with operation of the transfer arm so as to open the opening/closing valve. Alternatively, however, the opening/closing valve may be constructed so as to be opened a predetermined time after the opening/closing of the gate valve regardless of the operation of the transfer arm. It is also possible to mount various sensors such as an encoder and an optical sensor serving to monitor the movements and behaviors of the members of the apparatus such as the transfer arm in order to open the opening/closing valve in response to the movements of the other members of the apparatus. In this case, the opening/closing valve is opened in response to a trigger signal supplied from any of these sensors. Alternatively, it is possible to set the timing at which the trigger signal is supplied in a predetermined program in place of supplying the trigger signal in response to the movements of the other members of the apparatus.

In the third embodiment described previously, the gas supply pipe is branched into three branched passageways, and an opening/closing valve, a gas loading chamber and a flow rate control valve are mounted to each of these branched passageways. Alternatively, it is also possible to branch the gas supply pipe into two branched passageways and to mount an opening/closing valve, a gas loading chamber and a flow rate control valve to each of these branched passageways to meet the requirement for boosting the inner pressure of the wafer transfer chamber.. Further, it is also possible to connect a plurality of independent gas supply passageways to the common transfer chamber. In this case, an opening/closing valve, a gas loading chamber, a flow rate control valve, and a regulator are mounted to each of these independent gas supply passageways, and a gas supply source is connected to each of these independent gas supply passageways.

Further, in each of the first to third embodiments described above, the opening/closing valve and the flow rate control valve are mounted to the gas supply pipe or the branched gas passageway downstream and upstream, respectively, of the gas loading chamber. However, the present invention is not limited to the particular construction. To be more specific, the present invention can be worked as far as at least one valve means is mounted between the transfer chamber and the gas supply source, and a gas loading space is defined upstream of the particular valve means. Further, in each of the embodiments described above, the gas loading space is defined to include that region of the gas supply pipe which is positioned between the two valve means and the gas loading chamber which is connected to the gas supply pipe and has a cross sectional area larger than that of the gas supply pipe. It should be noted, however, that it is possible to omit the gas loading chamber, if that region of the gas supply pipe which is positioned between the two valve means is allowed to have a sufficiently large volume by increasing the length or inner diameter of the particular region of the gas supply pipe.

In each of the first to third embodiments described above, the pressure of the inert gas supplied from the gas loading space into the common transfer chamber is determined on the basis of the inner volume and the inner pressure of each of the gas loading space and the common transfer chamber. However, the present invention is not limited to the particular construction. Specifically, the temperature of the gas inside the common transfer chamber and the gas loading space can also be taken into consideration in determining the pressure of the inert gas supplied from the gas loading space into the common transfer chamber in addition to the inner volume and the inner pressure noted above.

In each of the first to third embodiments described above, two cassette chambers and three vacuum process chambers are connected to a single common transfer chamber. However, the present invention is not limited to the particular construction. Specifically, the technical idea of the present invention can be employed as far as the vacuum processing apparatus comprises at least one transfer chamber and at least one vacuum process chamber. Further, the technical idea of the present invention can be employed to the case where the inner pressure of a certain chamber formed within a hermetic vessel is boosted to a predetermined target pressure.

Still further, a semiconductor wafer is used as a target object to be processed in each of the embodiments described above. However, it may be of no difficulty to understand that other target objects such as glass substrates of a liquid crystal display device can also be processed in the vacuum processing apparatus of the present invention as far as the target objects are processed within a vacuum process chamber. Further, it may be of no difficulty to understand that the vacuum chamber included in the apparatus of the present invention is not necessarily limited to a chamber which is evacuated to a high degree of vacuum. In other words, a chamber evacuated to a low degree of vacuum can also be used in the present invention as far as the chamber is evacuated.

In the present invention, a valve means is mounted to a gas supply system which is connected to a wafer transfer chamber, and a gas loading space is defined upstream of the valve means. It follows that the gas of the predetermined pressure, volume and temperature stored in the gas loading chamber can be instantly supplied into the wafer transfer chamber by simply opening the valve means. As a result, it is possible to shorten markedly the time required for boosting the inner pressure of the wafer transfer chamber to reach a desired target pressure. Further, since it is possible to set the gas loaded in the gas loading chamber to meet not only the target pressure but also the target time, the inner pressure of the transfer chamber can be boosted to the target pressure in the target time.

It should also be noted that the apparatus of the present invention comprises, as desired, a plurality of systems each including a gas loading chamber and valves mounted upstream and downstream of the gas loading chamber. A gas of a predetermined pressure, volume and temperature can be loaded in each system. It follows that it is possible to select a suitable system from among the plural systems in accordance with the target pressure set for the wafer transfer chamber. As a result, it is possible to supply a gas of a desired condition into the transfer chamber, making it possible to boost the inner pressure of the transfer chamber to the target pressure in a substantially shorter time. Further, since the system including the gas loading chamber can be selected to meet not only the target pressure but also the target time, the inner pressure of the transfer chamber can be boosted to the target pressure in the target time. Still further, since these systems can be selected by switching the valve means mounted upstream and downstream of the gas loading chamber, the gas of a desired condition can be supplied into the transfer chamber easily and without fail.

What should also be noted is that, since the target time can be determined in accordance with the movement of the transfer arm, the inner pressure of the transfer chamber can be boosted by, for example, simply operating the transfer arm. Further, the target pressure within the transfer chamber is set at 66.7 Pa or less. It follows that, even if particles are present inside the transfer chamber, the inner pressure of the transfer chamber can be boosted without causing the particles to fly up. Still further, a predetermined amount of a gas for the pressure control can be supplied into the transfer chamber at the time when the inner pressure of the transfer chamber has reached a predetermined pressure, making it possible to maintain constant the inner pressure of the transfer chamber after the pressure boosting operation at a desired level.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum processing method using a vacuum processing apparatus provided with a transfer chamber, a first process chamber connected to said transfer chamber via a first gate valve, a target object to be processed being processed under a first pressure within said first process chamber, and a second process chamber connected to said transfer chamber via a second gate valve, said target object being processed under a second pressure within said second process chamber, said vacuum processing method comprising the steps of;

a first transfer step for transferring said target object processed within said first process chamber into said transfer chamber by opening said first gate valve, an inner pressure of said transfer chamber being reduced to a pressure equal to said first pressure in said first process chamber;

a step of closing said first gate valve to break a communication between said first process chamber and said transfer chamber;

a second transfer step for transferring said target object within said transfer chamber from a region close to said first gate valve to a region close to said second gate valve;

a step for introducing an inert gas, after said first gate valve is closed, from a gas supply source into a gas loading space connected to said transfer chamber via an opening-closing valve, with said opening-closing valve kept closed, so as to set up a third pressure $P_3$ of the inert gas within said gas loading space, which is higher than said second pressure and for reducing said inner pressure within said transfer chamber to a fourth pressure $P_4$ lower than said second pressure;

a step of opening said opening-closing valve to supply the inert gas stored in said gas loading space into said transfer chamber so as to increase said inner pressure of said transfer chamber to a fifth pressure $P_5$ equal to or higher than said second pressure; and a third transfer step for opening said second gate valve to transfer said target object into said second process chamber, wherein said third pressure $P_3$ is:

$$P_3 = \{V_1(P_5 - P_4)\}/V_2,$$

where $V_1$ denotes an inner volume of said transfer chamber, and $V_2$ denotes an inner volume of said gas loading space.

wherein said inner volume $V_1$ of said transfer chamber and said inner volume $V_2$ of said gas loading space have a relationship, as follows:

$$V_1 + V_2 \approx V_1.$$

2. The vacuum processing method according to claim 1, wherein said fifth pressure $P_5$ is any one of equal to and less than 66.7 Pa.

3. The vacuum processing method according to claim 1, wherein the inert gas within said gas loading space is controlled at a constant temperature.

4. The vacuum processing method according to claim 1, wherein a first gas loading chamber defining said gas loading space therein is interchangeable with a second gas loading chamber having an inner volume conforming with said inner volume of said transfer chamber.

5. The vacuum processing method according to claim 1, wherein said inner volume of said gas loading space and said third pressure $P_3$ within said gas loading space are set to permit said inner pressure of said transfer chamber to reach said fifth pressure in any one of equal to and less than 0.2 second after said opening-closing valve is opened.

6. A vacuum processing method using a vacuum processing apparatus provided with a transfer chamber, and a process chamber connected to said transfer chamber via a gate valve, a target object to be processed being processed within said process chamber, said vacuum processing method comprising the steps of:

a step for introducing an inert gas, before said target object is transferred from said transfer chamber into said process chamber, from a gas supply source into a gas loading space connected to said transfer chamber via an opening-closing valve, with said opening-closing valve kept closed to set up a second pressure $P_2$ of the inert gas within said gas loading space which is higher than a first pressure within said process chamber, and for reducing an inner pressure within said transfer chamber to a third pressure $P_3$ lower than said first pressure;

a step of opening said opening-closing valve to supply the inert gas stored in said gas loading space into said transfer chamber to set up a fourth pressure $P_4$ any one of equal to and higher than said first pressure; and a transfer step of transferring said target object into said process chamber by opening said gate valve, wherein said second pressure $P_2$ is defined by an equation, as follows:

$$P_2 = \{V_1(P_4 - P_3)\}/V_2,$$

wherein $V_1$ denotes an inner volume of said transfer chamber, and $V_2$ denotes an inner volume of said gas loading space.

* * * * *